United States Patent [19]
Saito et al.

[11] Patent Number: 4,672,221
[45] Date of Patent: Jun. 9, 1987

[54] PHOTOELECTRIC CONVERSION ELEMENT WITH LIGHT SHIELDING CONDUCTIVE LAYER

[75] Inventors: Tamio Saito, Tokyo; Kouhei Suzuki, Yokohama, both of Japan

[73] Assignee: Tokyo Shibaura Denki Kabushiki Kaisha, Kawasaki, Japan

[21] Appl. No.: 824,938

[22] Filed: Feb. 3, 1986

Related U.S. Application Data

[63] Continuation of Ser. No. 530,383, Sep. 8, 1983, abandoned.

[30] Foreign Application Priority Data

Nov. 1, 1982 [JP] Japan ................ 57-190799

[51] Int. Cl.⁴ .................. H01L 27/14; H01L 31/02
[52] U.S. Cl. .................. 250/578; 250/211 J; 357/30
[58] Field of Search ............... 250/578, 211 J, 211 K, 250/211 R, 237 R; 358/209, 212, 213; 357/24 LR, 30

[56] References Cited

U.S. PATENT DOCUMENTS 3,577,175  4/1971  Gri et al. .
4,200,892  4/1980  Weimer .
4,354,104 10/1982  Chikamura et al. ........... 250/211 J
4,408,230 10/1983  Tamura et al. ................. 358/213
4,419,696 12/1983  Hamano et al. ................ 358/294
4,430,564  2/1984  Fisher ............................ 250/211 R
4,484,223 11/1984  Tsunekawa .................... 358/213
4,496,834  1/1984  Nanba et al. .................. 250/211 R

FOREIGN PATENT DOCUMENTS 2536350  2/1977  Fed. Rep. of Germany .
2723914 12/1977  Fed. Rep. of Germany .
3031759  3/1981  Fed. Rep. of Germany .
2088357  1/1972  France .
2335053  7/1977  France .
2074788 11/1981  United Kingdom .

OTHER PUBLICATIONS

"An Amorphous Si High Speed Linear Image Sensor" 13th Conf. on Solid State Device (Tokyo, 1981) B-2-1, T. Hamano et al.
"A Contact-type Linear Sensor with a GD a-Si:H Photodetector Array", IEEE, IEDM 81-313, Y. Kanoh et al.
"Design and Evaluation of A4 Amorphous Si Hybrid Image Sensor", IMC 1982, Proc. (Tokyo 1982) pp. 132-137, T. Ozawa et al.
Patents Abstracts of Japan, vol. 7, No. 182 (E-192)[1327], Aug. 11, 1983; & JP-A-58 87 862 (Fuji Xerox K.K.) 5-25-1983.
Patents Abstracts of Japan, vol. 6, No. 259 (E-149)[1137], Dec. 17, 1982; & JP-A-57 157 563 (Tokyo Shibura Denki K.K.) 9-29-1982.

Primary Examiner—David C. Nelms
Assistant Examiner—Charles F. Wieland
Attorney, Agent, or Firm—Oblon, Fisher, Spivak, McClelland & Maier

[57] ABSTRACT

A photoelectric conversion element comprises a substrate, a plurality of separate electrodes arranged in a row on the substrate, signal lead-out parts extending from the separate electrodes alternately to the left and the right in a direction perpendicular to the arranging direction of the separate electrodes, a photoelectric conversion layer covering the row of the separate electrodes, a transparent electrode formed on the photoelectric conversion layer, and a light shielding conductive layer formed on the transparent electrode. The light shielding conductive layer is shaped to shield the light beam projected toward the overlapping portion between at least those portions of the signal lead-out parts which abut against the separate electrodes and the photoelectric converison layer.

7 Claims, 9 Drawing Figures

F I G. 4
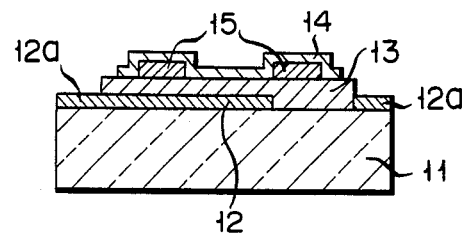
F I G. 5
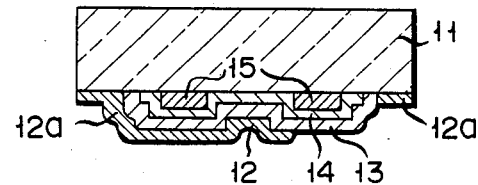
F I G. 6
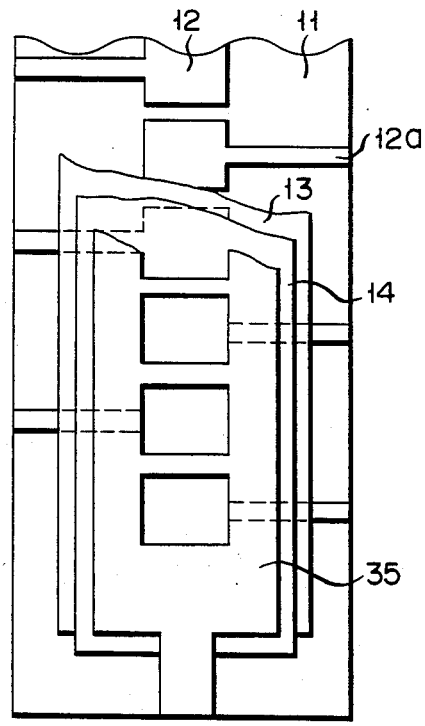

PHOTOELECTRIC CONVERSION ELEMENT WITH LIGHT SHIELDING CONDUCTIVE LAYER

This application is a continuation of application Ser. No. 530,383, filed Sept. 8, 1983, now abandoned.

BACKGROUND OF THE INVENTION

The present invention relates to a photoelectric conversion element.

A photoelectric conversion element, which serves to convert a quantity of light into a quantity of electricity such as an electric charge quantity or change of conductance, is used in an image sensing device included in, for example, facsimile or a copying machines.

A photoelectric conversion element using a CCD (charge coupled device) is under development. However, the phosphor screen width is small in this element, with the result that it is necessary to reduce the optical information by a lens system for projection into the phosphor screen. Naturally, the photoelectric conversion element necessitates a reduction lens system, leading to enlargement of the device. Also miniaturization of the image is restricted by the reduction requirements.

A photoelectric conversion element which is substantially equal in width to the object is also under development. Naturally, a reduction lens system is unnecessary in this element. Such a conventional photoelectric conversion element is constructed as shown in FIGS. 1A and 1B, for example. FIG. 1A is a plan view showing a part of a photoelectric conversion element, and FIG. 1B is a cross-sectional view along line A—A shown in FIG. 1A. As seen from the drawing, a plurality of separate electrodes 2 made of aluminum or chromium are arranged in a row on a glass substrate 1. These separate electrodes 2 are covered with a photoelectric conversion layer 3. Further, the photoelectric layer 3 is covered with a transparent electrode 4. Since the transparent electrode 4 has low electric conductivity, an auxiliary electrode 5 is generally provided.

The overlapped portion of the separate electrodes 2, photoelectric conversion layer 3, and transparent electrode 4 performs the light detecting function. Thus, a photoelectric conversion element is designed such that the overlapped portion alone acts as a light sensing part. However, it is difficult to allow the transparent electrode 4 to overlap with the separate electrodes 2 only, i.e., not to allow the transparent electrode 4 to overlap with the lead-out parts 2a of the separate electrodes 2. In general, the transparent electrode 4 is formed by mask sputtering. There is about 200 $\mu$m in repeatability error of mask alignment in the mask sputtering method. As a result, the transparent electrode 4 is partially overlapped with the lead-out parts 2a of the separate electrodes 2. Since the overlapped portion also detects light, noise is generated, resulting in deterioration of resolution in the sub-scanning direction.

Recently, an image sensing device has been demanded for reading out accurately fine images, which makes it desirable to finely divide the separate electrodes 2 to increase the density thereof. In the construction shown in FIGS. 1A and 1B, however, it is impossible to increase the separate electrode density satisfactorily because the signal lead-out parts 2a of the separate electrodes 2 are provided on one side only. The signal of the photoelectric conversion element is read out through lead wires connected to the signal lead-out parts 2a by using a wire bonder. In order to avoid mutual contact of adjacent lead wires, the maximum density of the signal read-out parts 2a in the post was 8 wires/mm. Naturally, the maximum density of the separate electrodes 2 was also 8 electrodes/mm, rendering it difficult to read out fine images of more than 8 lines/mm accurately.

SUMMARY OF THE INVENTION

An object of the present invention is to provide a photoelectric conversion element low in noise generation, free of resolution deterioration in the subscanning direction, and capable of reading out fine images accurately.

According to the present invention, there is provided a photoelectric conversion element, comprising: a substrate, a plurality of separate electrodes arranged in a row on the substrate, signal lead-out parts extending from the separate electrodes alternately to the left and the right, a photoelectric conversion layer convering the row of the separate electrodes, a transparent electrode formed on the photoelectric conversion layer, and a light shielding conductive layer formed on the transparent electrode to shield the light projected toward the overlapping portion between at least those portions of the signal lead-out parts which abut against the separate electrodes and the photoelectric conversion layer.

Insulating materials such as ceramics and glass are used as the substrate in the present invention. Since a ceramic substrate is porous, it is desirable to form a glaze layer on the surface to obtain a smooth surface.

The separate electrodes and signal lead-out parts are made of a metal such as Al, Cr, Ti, V, W, and In, and can be formed by evaporation, sputtering, or the like. The separate electrodes serve to detect the electric quantity converted by the photoelectric conversion layer. On the other hand, the signal lead-out parts serve to lead the signals from the separate electrodes to the outside. Generally, separate electrodes and signal lead-out parts are integrally formed.

Various known photoconductive materials, which permit converting a light quantity into an electric quantity such as charge quantity or a change of conductance, can be used for forming the photoelectric conversion layer. The photoconductive materials mentioned include, inorganic photoconductive materials such as amorphous silicon, amorphous SiC, poly-Si and amorphous germanium; organic dyestuffs such as merocyanine, phthalocyanine, pyrrium, and squarium; and organic photoconductive materials such as porphyrin, ruthenium trisbipyrydine complex, and a mixture of titanium oxide and methylviologen.

Materials having electric conductivity and transmitting light such as nesa film, ITO (indium tin oxide) film and gold thin film can be used as the transparent electrode.

The light shielding conductive layer, while compensating for the conductivity of the transparent electrode, serves to shield the light projected to the overlapping portion between the signal lead-out part and the photoelectric conversion layer. The light shielding conductive layer is formed of metals like Al, Au, Mo, Mn, Ni, Cr, Cu, Ti, V, W, Ag, Pd, Pt, In, Pb, and conductive epoxy resin, etc. These materials are deposited or coated by the ordinary method, followed by selectively etching the deposited or coated layer to form a light shielding layer of a desired form.

In the photoelectric conversion element having the construction described above, it is possible to shield the light projected onto an undesirable portion, i.e., an overlapping portion among the signal lead-out part, photoelectric conversion layer, and transparent electrode, thereby making it possible to suppress the noise generated from the overlapping portion. Also, since the light shielding conductive layer performing the shielding function is capable of compensating for the conductivity of the transparent electrode, the auxiliary electrode used in the past need not be provided in the present invention.

Further, since the auxiliary electrode need not be provided on one side of the substrate as mentioned above, it is possible to allow the signal lead-out parts to extend to the left and right in a direction perpendicular to the arranging direction of the separate electrodes. As a result, the density of the signal lead-out parts can be reduced to half the conventional level and the density of the separate electrodes can be increased to about twice the conventional level, so that a very fine photoelectric conversion element can be made.

The photoelectric conversion element of the present invention is suitable for use as a large image sensor which does not require a reduction lens system.

BRIEF DESCRIPTION OF THE DRAWINGS

FIG. 4 is a cross-sectional view of the photoelectric conversion element according to another embodiment of the present invention;

FIG. 5 is a cross-sectional view of the photoelectric conversion element according to another embodiment of the present invention; and FIG. 6 is a plan view of the photoelectric conversion element according to still another embodiment of the present invention.

DETAILED DESCRIPTION OF THE PREFERRED EMBODIMENT

Figure 2A:
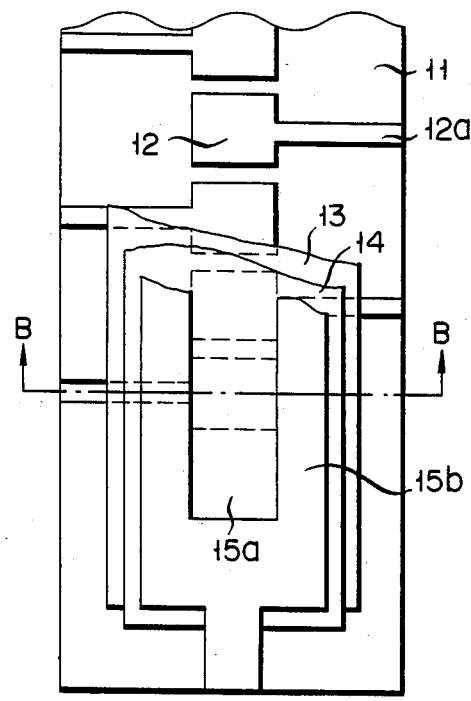
FIG. 2A is a plan view of the photoelectric conversion element according to one embodiment of the present invention.
Figure 2B:
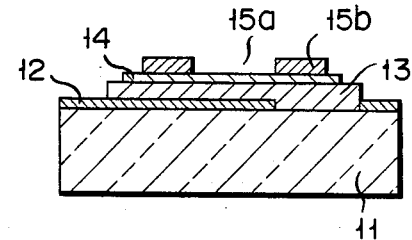
FIGS. 2B and 2C are cross-sectional views along line B—B of FIG. 2A.

FIG. 2A is a plan view of the photoelectric conversion element according to one embodiment of the present invention, with FIG. 2B showing the cross-sectional view along line B—B of FIG. 2A. The photoelectric conversion element shown in FIGS. 2A and 2B is produced as follows.

In the first step, chromium is deposited on a glass substrate 11, followed by patterning of the deposited layer to form a plurality of separate electrodes 12 arranged in a row and provided with signal lead-out parts 12a. The separate electrodes 12 are covered with a photoelectric conversion layer 13 consisting of amorphous silicon and formed by the plasma CVD method. The photoelectric conversion layer 13 is covered with a transparent electrode 14 consisting of an ITO film and formed by sputtering or spraying. Further, an aluminum film is deposited on the transparent electrode 14. The aluminum film is selectively etched to remove the region above the row of separate electrodes 12, thereby forming a light shielding electrode 15b having a slit-like opening 15a. The light shielding electrode 15b covers that portion of the transparent electrode 14 which corresponds to the signal lead-out parts 12a abutting against the separate electrodes 12. If an acid etching liquid is used to etch the light shielding electrode 15b, the ITO film constituting the transparent electrode 14 is etched. Thus, it is necessary to use an alkali etching liquid, e.g., an aqueous solution of sodium hydroxide. The etching is performed by using, for example, a resist pattern as a mask. The mask can be aligned with high accuracy of, e.g., several microns.

Figure 2C:
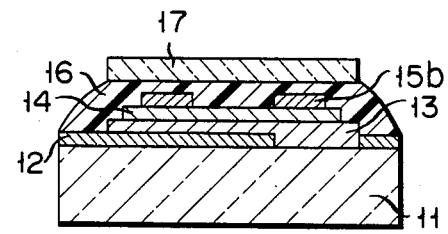

As shown in FIG. 2C, the structure shown in FIGS. 2A and 2B may be coated with a moistureproof protective layer 16. Further, the moistureproof protective layer 16 may be covered with a glass layer 17. The moisture-proof protective layer 16 is formed of organic resins such as silicone, acrylic and urethane; and inorganic materials such as $SiO_2$, $Al_2O_3$, $Ta_2O_5$, $Si_xN_{1-x}$, $S_xC_{1-x}$, $Si_xN_yH_z$ and $Si_xC_yH_z$ ($10^{-3}<x<1$, $10^{-3}<y<1$, $10^{-3}<z<1$, $x+y+z=1$).

In the photoelectric conversion element having the construction described above, the light projected onto the overlapping portion among the signal lead-out parts 12a, photoelectric conversion element 13, and transparent electrode 14 is shielded by the light shielding conductive layer 15b to prevent noise generation from the overlapping portion. Also, since the signal lead-out parts 12a extend from the separate electrodes 12 alternately to the left and right in a direction perpendicular to the arranging direction of the separate electrodes 12, it is possible to reduce the density of the signal lead-out parts 12a to half the level of the conventional photoelectric conversion element. Likewise, the density of the separate electrodes can be increased to about twice the conventional level. For example, the upper limit of the density of the signal lead-out parts is about 8 lead-out parts/mm in the conventional photoelectric conversion element because of the restriction in packaging. Thus, the upper limit of the density of the separate electrodes is also 8 electrodes/mm in the conventional element. In the present invention, however, the signal lead-out parts 12 are disposed on both sides of the substrate. Thus, if the density of the signal lead-out parts 12a on one side is set at 8 lead-out parts/mm as in the conventional element, the density on both sides, i.e., the density on the elment, is 16 lead-out parts/mm. In other words, it is possible to increase the density to at least 12 lead-out parts/mm in contrast to about 8 lead-out parts/mm for the conventional element. As a result, it is possible to obtain very fine photoelectric conversion elements.

Further, it is possible for the light shielding conductive film 14 to compensate for the conductivity of the transparent electrode 14, making it possible to eliminate the auxiliary electrode provided on one side of the substrate in the conventional element. In the photoelectric conversion element which does not include a light shielding conductive film, the transparent electrode has a resistance as high as about 10 k$\frac{5}{8}$. In the device of the present invention comprising a light shielding conductive film, however, the resistance of the transparent electrode is less than 1/100 the value for the element which does not include a light shielding conductive film. It follows that the photoelectric conversion element of the present invention is effective for detecting fine signals. Particularly, where the element is used in the store mode, the signal read-out speed is not lowered because the resistance of the transparent electrode influences the time constant of the signal read-out.

In a contact type image sensor, it is necessary to converge a light beam by, for example, a rod array lens to guide the beam to the photoelectric conversion element. If the photoelectric conversion element of the present invention provided with a light shielding conductive layer having a slit-like opening is used in such an image sensor, the light beam projected onto the undesired portion is shielded by the light shielding conductive layer to enable the image sensor to operate quite satisfactorily.

In a photoelectric conversion element, the signals generated from the separate electrodes are read out by turning on successively the MOS switches connected to the separate electrodes. It should be noted that the dark output during light non-irradiation time does not become 0 because of the influences of the switching noise of the MOS switches in reading out the signals, the off-set voltage and internal bias of the output signal amplifier for the read out signals, etc., with the result that the ratio of the dark output to the photo output during the light irradiation time becomes small. To overcome the difficulty, it was customary to record the dark output in the manufacturing step of the photoelectric conversion element. In this case, the difference between the recorded dark output and the photo output is compensated in a later stage circuit. However, the dark current tends to vary depending on changes in conditions such as temperature and humidity. Also, the circuit construction is complex.

Figure 1A:
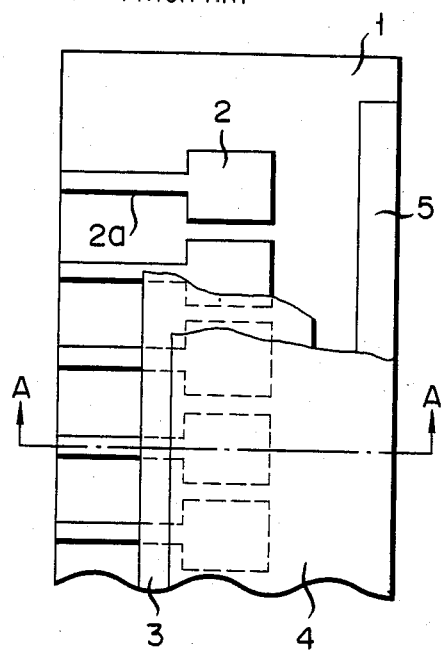
FIG. 1A is a plan view of a conventional photoelectric conversion element.
Figure 1B:
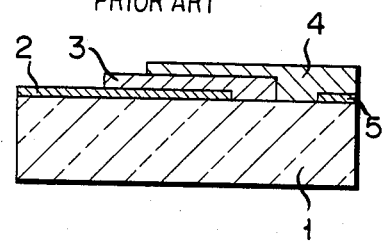
FIG. 1B is a cross-sectional view along line A—A of FIG. 1A.
Figure 3:
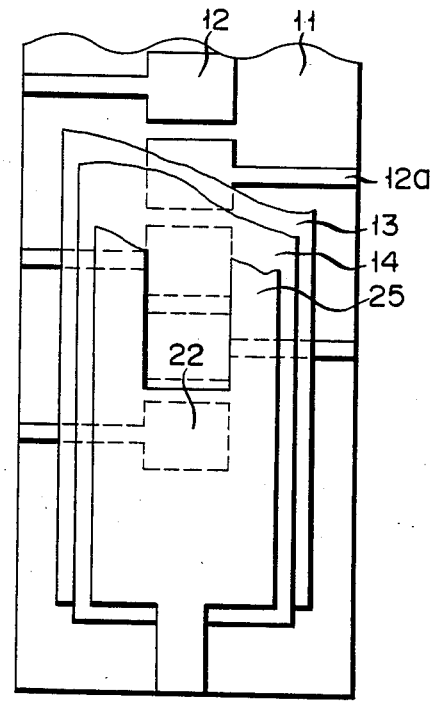
FIG. 3 is a plan view of the photoelectric conversion element according to another embodiment of the present invention.

FIG. 3 is a plan view showing a photoelectric conversion element according to another embodiment of the present invention. The element shown in FIG. 3 makes it possible to overcome the difficulties mentioned above. As seen from the drawing, the embodiment of FIG. 3 is equal to the element shown in FIG. 2A except that, in FIG. 3, a separate electrode 22 included in the series of separate electrodes, as well as the signal lead-out parts 12a, is covered with a light shielding conductive layer 25. Incidentally, it is possible to shield two or more separate electrodes in the present invention.

In the embodiment of FIG. 3, the separate electrode 22 shielded by the light shielding conductive (layer) 25 always generates a dark output conforming with changes in conditions, which makes it possible to overcome the difficulties mentioned above. It is not absolutely necessary to have the separate electrode 22 for obtaining a dark output shielded by the light shielding conductive layer 25. Alternatively, the separate electrode 22 may be shielded by a light shielding film formed of, for example, an opaque resin cured at a relatively low temperature, including opaque silicone, opaque epoxy, etc. The light shielding film mentioned can be formed by means of dripping, printing, coating, etc. The curing temperature of the resin should be relatively low, e.g. about 100° C. or less, in order not to change the properties of the photoelectric conversion layer which is made of, for example, amorphous silicon. It is particularly desirable to use an ultraviolet curing type resin, because the heating for curing the resin is unnecessary. It is also possible to attach an opaque adhesive tape to the transparent electrode 14 to shield the separate electrode 22.

In the embodiments described above, the light shielding conductive layer or light shielding resin film is formed on the transparent electrode 14. However, it is also possible to form the light shielding conductive layer between the photoelectric conversion layer 13 and the transparent electrode 14, as seen from FIG. 4 showing a cross section. In this case, the light shielding conductive layer is formed on the photoelectric conversion layer, not on the transparent electrode formed of, for example, an ITO film, which is etched with an acid etchant. Thus, the scope of etchant selection is widened. For example, an acid etchant can be used for patterning the light shielding conductive layer.

FIG. 5 shows another embodiment of the present invention. In this case, light is incident on the photoelectric conversion layer through a transparent substrate 11. Specifically, FIG. 5 shows that a light shielding conductive layer 15, a transparent electrode 14, a photoelectric conversion layer 13, and separate electrodes 12 having signal lead-out parts 12a are formed in this order on the back surface of the substrate 11. In this embodiment, it is possible to interchange the light shielding conductive layer 15 and the transparent electrode 14.

In the embodiment of FIGS. 2A and 2B, the slit-like opening 15a is formed in the light shielding conductive layer 15b, with the result that the region between adjacent separate electrodes is not shielded. FIG. 6 shows still another embodiment of the present invention. In this case, a light shielding conductive layer 35 is provided with a number of openings corresponding to the separate electrodes 12 to shield the region between adjacent separate electrodes 12, too. This construction is applicable to color display by allowing the separate electrodes to correspond to RGB, respectively.

What is claimed is:

1. A photoelectric conversion element, comprising:
   a substrate;
   a plurality of separate electrodes arranged in a row on the substrate;
   signal lead-out parts extending from the separate electrodes alternately to the left and the right in a direction perpendicular to the arranging direction of the separate electrodes;
   a photoelectric conversion layer covering the row of the separate electrodes;
   a transparent electrode formed on the photoelectric conversion layer; and
   a light shielding conductive layer on that portion of the transparent electrode which corresponds to the region surrounding the row of the separate electrodes and which is narrower than said photoelectric conversion layer.

2. An element according to claim 1, wherein the light shielding conductive layer is formed of at least one material selected from a group consisting of A, Au, Mo, Mn, Ni, Cr, Cu, Ti, V, W, Ag, Pd, Pt, In, Pb, and conductive epoxy resin.

3. An element according to claim 1, wherein the light shielding conductive layer is provided with a slit-like opening corresponding to the row of the separate electrodes.

4. An element according to claim 3, wherein at least one of the separate electrodes is shielded by the light shielding conductive layer.

5. An element according to claim 3, wherein an opaque resin film is formed to fill a part of the opening of the light shielding conductive layer, thereby shielding said at least one separate electrode.

6. An element according to claim 1, wherein the light shielding conductive layer is provided with a plurality of openings corresponding to the separate electrodes.

7. A photoelectric conversion element, comprising:
a substrate;
a plurality of separate electrodes arranged in a row on the substrate;
signal lead-out parts extending from the separate electrodes alternately to the left and the right in a direction perpendicular to the arranging direction of the separate electrodes;
a photoelectric conversion layer covering the row of the separate electrodes;
a light shielding conductive layer narrower than said photoconversion layer and formed on that portion of the photelectric conversion layer which corresponds to the region surrounding the row of the separate electrodes; and
a transparent electrode formed on the light shielding conductive layer.

* * * * *